(12) United States Patent
Kim et al.

(10) Patent No.: US 11,721,681 B2
(45) Date of Patent: Aug. 8, 2023

(54) MICRO LED DISPLAY HAVING MULTI-COLOR PIXEL ARRAY AND METHOD OF FABRICATING THE SAME BASED ON INTEGRATION WITH DRIVING CIRCUIT THEREOF

(71) Applicant: Korea Advanced Institute of Science and Technology, Daejeon (KR)

(72) Inventors: Sanghyeon Kim, Daejeon (KR); DaeMyeong Geum, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 16/913,593

(22) Filed: Jun. 26, 2020

(65) Prior Publication Data
US 2021/0005589 A1    Jan. 7, 2021

(30) Foreign Application Priority Data

Jul. 1, 2019   (KR) ........................ 10-2019-0078572

(51) Int. Cl.
*H01L 25/16*   (2023.01)
*H01L 33/00*   (2010.01)
(Continued)

(52) U.S. Cl.
CPC ............ *H01L 25/167* (2013.01); *H01L 24/09* (2013.01); *H01L 24/32* (2013.01); *H01L 24/33* (2013.01);
(Continued)

(58) Field of Classification Search
CPC ............ H01L 27/3211; H01L 27/3248; H01L 27/3218; H01L 27/124; H01L 27/3209; H01L 25/043; H01L 25/0657; H01L 25/074; H01L 25/0756; H01L 25/117; H01L 25/0652; H01L 25/071; H01L 25/112; H01L 51/504–5044; H01L 51/5206–5218; H01L 2225/06503–06596; H01L 2224/46; H01L 2224/484–48499;
(Continued)

(56) References Cited

U.S. PATENT DOCUMENTS 9,515,288 B2 * 12/2016 Loebl .................. H01L 51/5253
2014/0284633 A1 * 9/2014 Tsay .................... H01L 25/0756
                                                                    257/88

(Continued)

FOREIGN PATENT DOCUMENTS

JP        2004247405 A    9/2004
KR    1020190003162 A    1/2019

*Primary Examiner* — Victor A Mandala
*Assistant Examiner* — Lawrence C Tynes, Jr.
(74) *Attorney, Agent, or Firm* — Hayes Soloway PC (57) ABSTRACT

Disclosed is a micro LED display having a multi-color pixel array and a method of fabricating the same based on integration with a driving circuit thereof. According to various embodiments, the display may be fabricated by providing an IC device in which a driving circuit has been wired, forming, in one surface of the IC device, a plurality of pixels on which a plurality of partial pixels for emitting different color lights has been stacked, and electrically connecting the partial pixels to the driving circuit using connection members.

11 Claims, 9 Drawing Sheets

(51) Int. Cl.
*H01L 33/62* (2010.01)
*H01L 23/00* (2006.01)

(52) U.S. Cl.
CPC .............. *H01L 24/48* (2013.01); *H01L 24/73* (2013.01); *H01L 33/0093* (2020.05); *H01L 33/62* (2013.01); *H01L 2224/02255* (2013.01); *H01L 2224/09164* (2013.01); *H01L 2224/32145* (2013.01); *H01L 2224/33181* (2013.01); *H01L 2224/48145* (2013.01); *H01L 2224/73265* (2013.01); *H01L 2933/0066* (2013.01)

(58) Field of Classification Search
CPC ......... H01L 2224/48151–48265; H01L 24/09; H01L 24/33; H01L 33/62; H01L 2224/73265; H01L 2224/48145; H01L 2224/32145; H01L 2933/0066; H01L 25/167; G09G 2300/0804; G09G 2300/0408; G09G 2300/0876; G09G 3/3266–3291; H10K 50/13; H10K 59/351
See application file for complete search history.

(56) References Cited

U.S. PATENT DOCUMENTS

| | | | |
|---|---|---|---|
| 2018/0374985 A1* | 12/2018 | Chen | H01L 33/10 |
| 2019/0053347 A1* | 2/2019 | Lee | H01L 27/30 |
| 2019/0165037 A1* | 5/2019 | Chae | H01L 33/62 |
| 2019/0165038 A1* | 5/2019 | Chae | H01L 33/30 |
| 2019/0165207 A1* | 5/2019 | Kim | H01L 33/505 |
| 2020/0343227 A1* | 10/2020 | Jang | H01L 33/0093 |

* cited by examiner

MICRO LED DISPLAY HAVING MULTI-COLOR PIXEL ARRAY AND METHOD OF FABRICATING THE SAME BASED ON INTEGRATION WITH DRIVING CIRCUIT THEREOF

CROSS REFERENCE TO RELATED APPLICATION

This application claims priority under 35 U.S.C. § 119 to Korean Patent Application No. 10-2019-0078572 filed on Jul. 1, 2019, which is incorporated herein by reference in its entirety.

BACKGROUND OF THE INVENTION

Various embodiments relate to a micro light-emitting diode (LED) display having a multi-color pixel array and a method of fabricating the same based on integration with a driving circuit thereof.

DESCRIPTION OF THE RELATED ART

In general, a display functions to implement an image based on an electrical signal. To this end, the display includes a pixel array having a plurality of pixels, and outputs image light through each of the pixels. In this case, each of the pixels includes a color filter for emitting a desired color light from a white light or a blue light. For this reason, each of the pixels has a complicated structure. There is a difficulty in reducing the size of the pixel. This may result in a problem in that resolution of the display is degraded. Phosphors within each of the pixels may cause a light loss in each of the pixels. Accordingly, there is a difficulty in reducing power of each of the pixels. Furthermore, the display is fabricated by fabricating the pixels and then individually arraying the pixels on a substrate. In this case, each of the pixels is positioned on the substrate using a pick and place method. For this reason, there is a difficulty in arranging the pixels at accurate locations on the substrate. This may result in a problem in that the yield of the display is degraded.

SUMMARY OF THE INVENTION

Various embodiments provide a display which can be easily fabricated and a method of fabricating the same.

Various embodiments provide a display capable of realizing a reduction in the size of pixels and lowering in power of each of the pixels at the same time and a method of fabricating the same.

Various embodiments provide a display in which pixels can be accurately arrayed and a method of fabricating the same.

A method of fabricating a display according to various embodiments may include providing an integrated circuit (IC) device in which a driving circuit has been wired, forming, in one surface of the IC device, a plurality of pixels on which a plurality of partial pixels for emitting different color lights has been stacked, and electrically connecting the partial pixels to the driving circuit using connection members.

A display according to various embodiments may include an integrated circuit (IC) device in which a driving circuit has been wired, a plurality of pixels arrayed in one surface of the IC device, wherein a plurality of partial pixels for emitting different color lights has been stacked on the plurality of pixels, and connection members electrically connecting the partial pixels to the driving circuit.

DETAILED DESCRIPTION

Hereinafter, various embodiments of this document are described with reference to the accompanying drawings.

Figure 1:
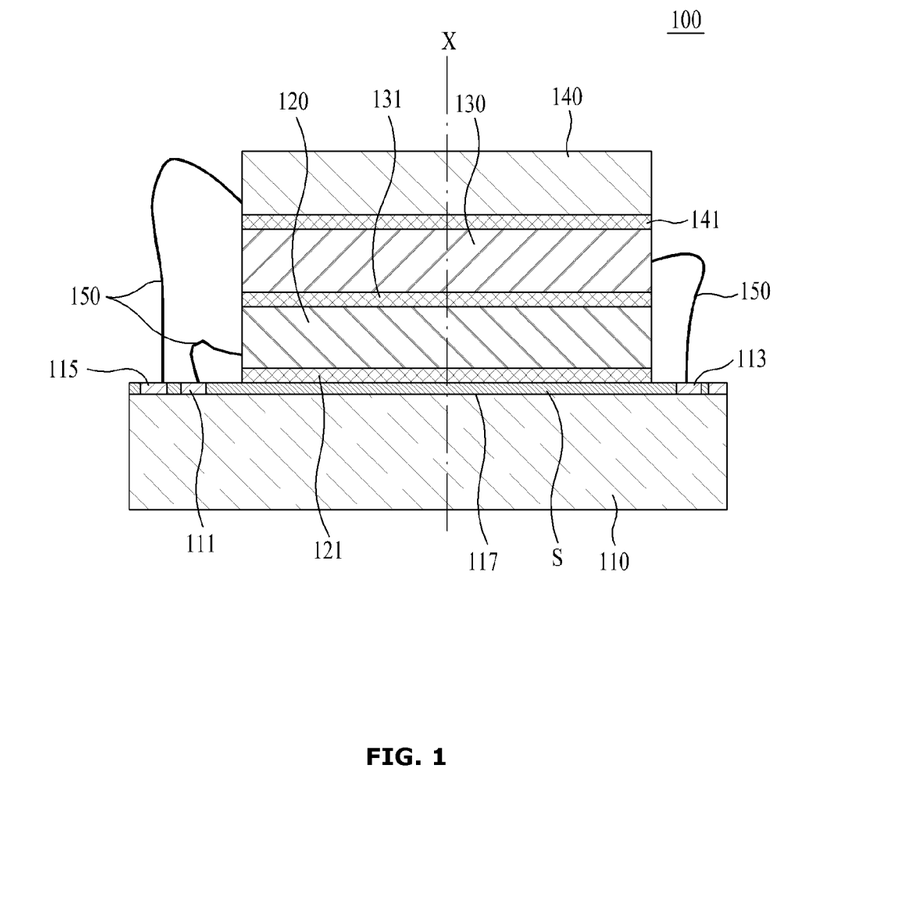
FIG. 1 is a diagram illustrating a display according to various embodiments.

FIG. 1 is a diagram illustrating a display 100 according to various embodiments.

Referring to FIG. 1, the display 100 according to various embodiments may include an integrated circuit (IC) device 110, a pixel array including a plurality of pixels 120, 130, and 140, and a plurality of connection members 150. According to various embodiments, the display 100 may be a micro light emitting diode (LED) display.

The IC device 110 may provide a driving signal to the pixels 120, 130, and 140. In this case, the IC device 110 may implement an image through the pixels 120, 130, and 140 based on the driving signal. To this end, the IC device 110 may include at least any one of a driving circuit (not illustrated), a plurality of pads 111, 113, and 115 or the passivation layer 117.

The driving circuit may have been wired within the IC device 110.

The pads 111, 113, and 115 are disposed in one surface S of the IC device 110, and may be connected to the driving circuit. The pads 111, 113, and 115 may include first pads 111, second pads 113 and third pads 115. In this case, one axis X that penetrates the one surface S of the IC device 110 may be defined. For example, the one surface S of the IC device 110 may be positioned on a plane vertical to the one axis X.

The passivation layer 117 can protect the one surface S of the IC device 110. In this case, the passivation layer 117 may expose the pads 111, 113, and 115 in the one surface S of the IC device 110. For example, the passivation layer 117 includes a plurality of openings for exposing the pads 111, 113, and 115. The openings may penetrate the passivation layer 117 in a direction parallel to the one axis X.

The pixels 120, 130, and 160 may be arrayed on the one surface S of the IC device 110. The pixels 120, 130, and 160 may output an image. In this case, each of the pixels 120, 130, and 140 may output image light based on the driving signal of the IC device 110. To this end, each of the pixels 120, 130, 140 may include a plurality of partial pixels 120, 130, 140. The partial pixels 120, 130, and 140 may emit different color lights. For example, each of the partial pixels 120, 130, and 140 may include a micro LED for emitting each color light. Accordingly, image light may be formed by a combination of color lights of the partial pixels 120, 130, and 140. The partial pixels 120, 130, and 140 may be stacked in the one axis X. The partial pixels 120, 130, and 140 may include a first partial pixel 120, a second partial pixel 130 and a third partial pixel 140.

The first partial pixel 120 may be mounted on the one surface S of the IC device 110. According to one embodiment, the first partial pixel 120 may include a first adhesion layer 121. The first adhesion layer 121 may bond the IC device 110 and the first partial pixel 120 between the one surface S of the IC device 110 and the first partial pixel 120. Accordingly, the first partial pixel 120 may be attached to the one surface S of the IC device 110 through the first adhesion layer 121. In this case, the first partial pixel 120 may be attached to the passivation layer 117 of the IC device 110. The first partial pixel 120 may emit a first color light. The first partial pixel 120 may emit the first color light based on the driving signal of the IC device 110. For example, the first color light may be a red (R) light.

The second partial pixel 130 may be stacked on the first partial pixel 120. The second partial pixel 130 may be stacked on the first partial pixel 120 in a direction parallel to the one axis X. According to one embodiment, the second partial pixel 130 may include a second adhesion layer 131. The second adhesion layer 131 may bond the first partial pixel 120 and the second partial pixel 130 between the first partial pixel 120 and the second partial pixel 130. In this case, the second adhesion layer 131 may be positioned on the side opposite the first adhesion layer 121 with the first partial pixel 120 interposed therebetween. Accordingly, the second partial pixel 130 may be attached to the first partial pixel 120 through the second adhesion layer 131. The second partial pixel 130 may emit a second color light. The second partial pixel 130 may emit the second color light based on the driving signal of the IC device 110. For example, the second color light may be a green (G) light.

The third partial pixel 140 may be stacked on the second partial pixel 130. The third partial pixel 140 may be stacked on the second partial pixel 130 in a direction parallel to the one axis X. According to one embodiment, the third partial pixel 140 may include a third adhesion layer 141. The third adhesion layer 141 may bond the second partial pixel 130 and the third partial pixel 140 between the second partial pixel 130 and the third partial pixel 140. In this case, the third adhesion layer 141 may be positioned on the side opposite the second adhesion layer 131 with the second partial pixel 130 interposed therebetween. Accordingly, the third partial pixel 140 may be attached to the first partial pixel 120 through the third adhesion layer 141. The third partial pixel 140 may emit a third color light. The third partial pixel 140 may emit the third color light based on the driving signal of the IC device 110. For example, the third color light may be a blue (B) light.

The connection members 150 may electrically connect the pixels 120, 130, and 140 to the driving circuit of the IC device 110. The connection members 150 may individually connect the partial pixels 120, 130, and 140 to the pads 111, 113, and 115 of the IC device 110. In this case, the connection members 150 may connect respective first partial pixels 120 and respective first pads 111, may connect respective second partial pixels 130 and respective second pads 113, and may connect respective third partial pixels 140 and respective third pads 115. Accordingly, the connection members 150 may transmit the driving signal of the IC device 110 to the pixels 120, 130, and 140. For example, the connection members 150 may include wires made of metal.

FIGS. 2A, 2B, 3, 4, 5, 6A, 6B, 7A and 7B are diagrams illustrating a method of fabricating a display 100 according to various embodiments.

Referring to FIGS. 2, 3, 4, 5, 6 and 7, the display 100 according to various embodiments may be fabricated using a semiconductor fabrication scheme. That is, the IC device 110 having the driving circuit is prepared. Thereafter, the pixel array including the pixels 120, 130, and 140 may be formed on the IC device 110. Thereafter, the IC device 110 and the pixels 120, 130, and 140 may be electrically connected.

Figure 2A:
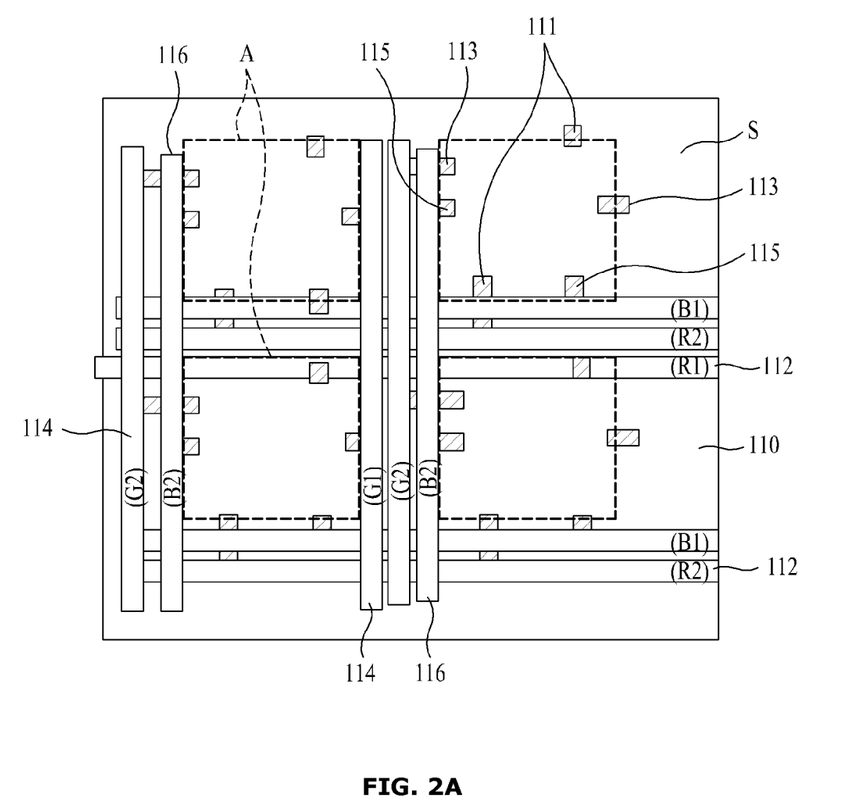
FIGS. 2A, 2B, 3, 4, 5, 6A, 6B, 7A and 7B are diagrams illustrating a method of fabricating a display according to various embodiments.
Figure 2B:
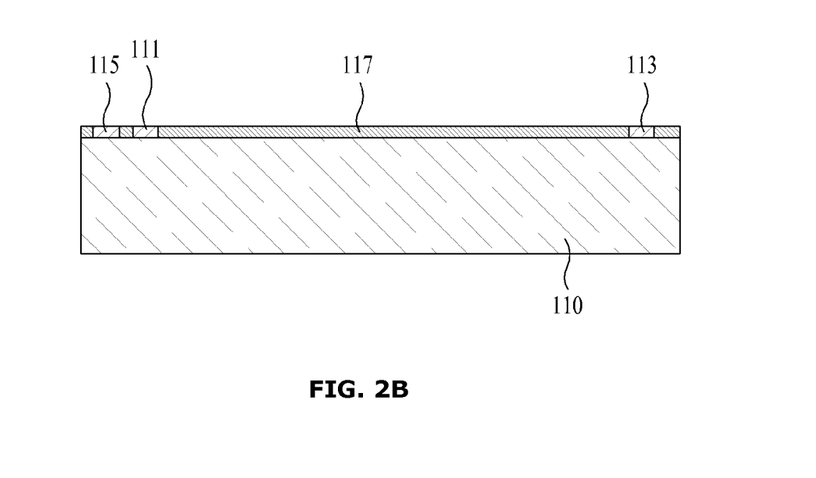

First, as illustrated in FIGS. 2A and 2B, the IC device 110 may be provided. In this case, the IC device 110 may be provided in a wafer form. The IC device 110 may be fabricated to provide a driving signal for implementing an image. To this end, the IC device 110 may include the driving circuit. The driving circuit may be wired within the IC device 110. Furthermore, the IC device 110 may be implemented as a pixel structure. The one surface S of the IC device 110 may be divided into a plurality of pixel areas A arrayed based on the pixel structure. For example, the pixel areas A may be arrayed as a predetermined structure. In this case, the one axis X penetrating the one surface S of the IC device 110 may be defined. For example, the one surface S of the IC device 110 may be positioned on a plane vertical to the one axis X.

The IC device 110 may include the plurality of pads 111, 113, and 115 and a plurality of buses 112, 114, and 116. The pads 111, 113, and 115 may be configured to provide a driving signal to the outside. The pads 111, 113, and 115 may be disposed in the pixel areas A in the one surface S of the IC device 110, and may be connected to the driving circuit. The pads 111, 113, and 115 may include the first pads 111, the second pads 113 and the third pads 115. The buses 112, 114, and 116 may be provided to receive an image signal, related to a driving signal, from the outside. The buses 112, 114, and 116 are spaced apart from the pads 111, 113, and 115 in the one surface S of the IC device 110, and may be connected to the driving circuit. The buses 112, 114, and 116 may include at least one first bus 112, at least one second bus 114 and at least one third bus 116, respectively. The first bus 112, the second bus 114 and the third bus 116 may be connected to the first pads 111, the second pads 113 and the third pads 115, respectively, through the driving circuit.

According to one embodiment, the IC device 110 may further include the passivation layer 117. The passivation layer 117 may be positioned on the one surface S of the IC device 110. In this case, the passivation layer 117 may expose the pads 111, 113, and 115 in the one surface S of the IC device 110. For example, the passivation layer 117 includes a plurality of openings for exposing the pads 111, 113, and 115. The openings may penetrate the passivation layer 117 in a direction parallel to the one axis X.

Figure 3:
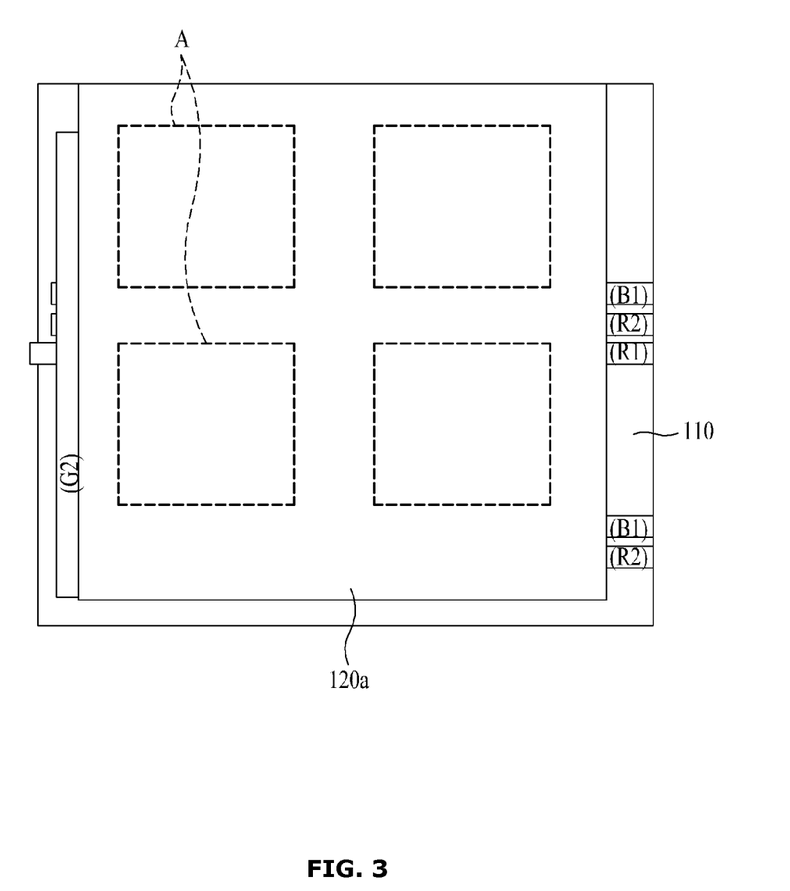
Figure 4:
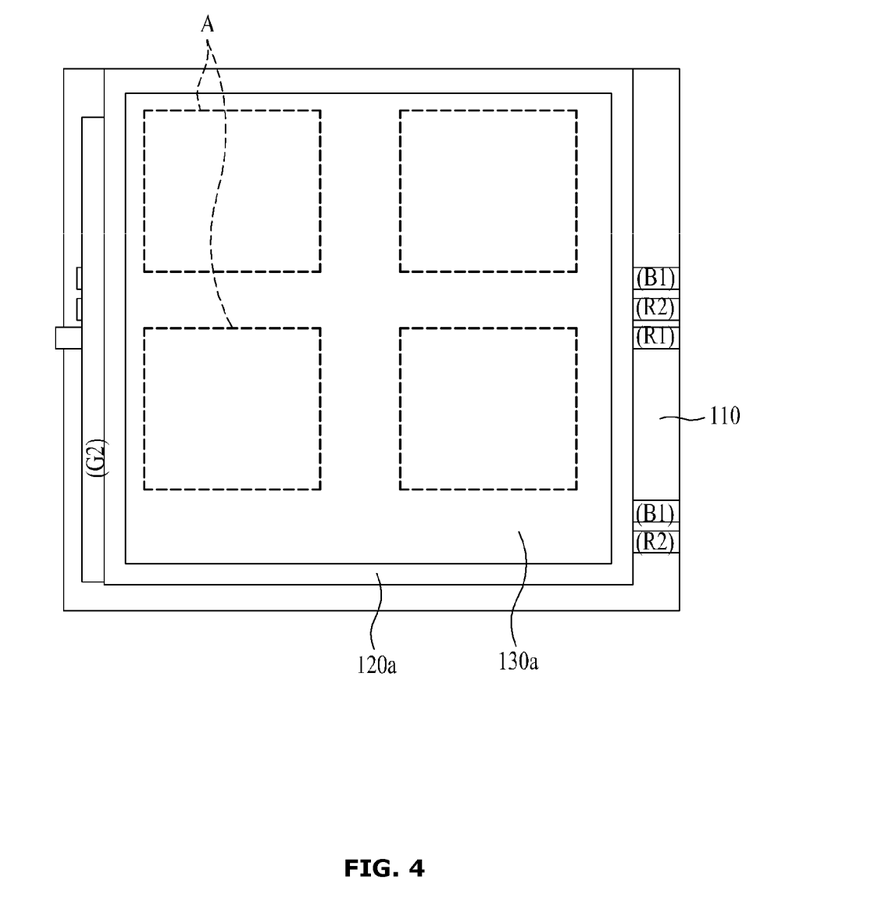
Figure 5:
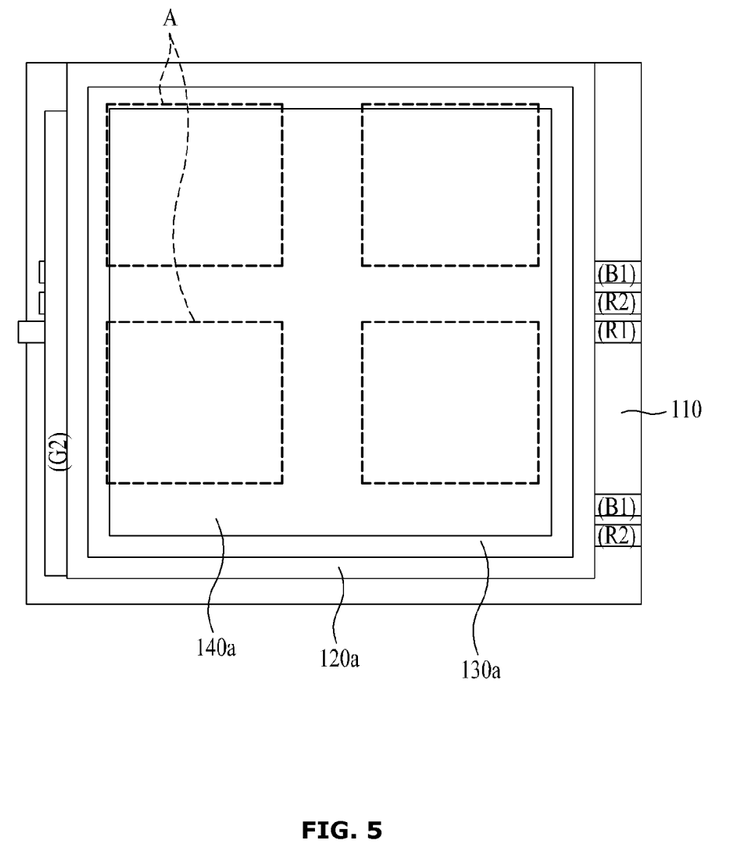

Next, as illustrated in FIGS. 3, 4 and 5, assemblies 120a, 130a, and 140a may be formed in the one surface S of the IC device 110. The assemblies 120a, 130a, and 140a may be formed to cover all the pixel areas A in the one surface S of the IC device 110. The assemblies 120a, 130a, and 140a may include a plurality of pixel layers 120a, 130a, and 140a, that is, a first pixel layer 120a, a second pixel layer 130a and a third pixel layer 140a. The first pixel layer 120a may be formed to emit the first color light. In this case, the first pixel layer 120a may be formed to include the first adhesion layer 121. The second pixel layer 130a may be formed to emit the second color light. In this case, the second pixel layer 130a may be formed to include the second adhesion layer 131. The third pixel layer 140a may be formed to emit the third color light. In this case, the third pixel layer 140a may be formed to include the third adhesion layer 141.

For example, the pixel layers 120a, 130a, and 140a may be grown on a plurality of substrates (not illustrated). Furthermore, the assemblies 120a, 130a, and 140a may be formed in such a way as to attach any one of the pixel layers 120a, 130a, and 140a to the one surface S of the IC device 110 or the other of the pixel layers 120a, 130a, and 140a and then remove the substrate from any one of the pixel layers 120a, 130a, and 140a. The substrates may include a first substrate for the first pixel layer 120a, a second substrate for the second pixel layer 130a, and a third substrate for the third pixel layer 130a.

According to one embodiment, the pixel layers 120a, 130a, and 140a may be grown in a direction parallel to the one axis X in the one surface S of the IC device 110. That is, the first pixel layer 120a may be attached to the one surface S of the IC device 110, the second pixel layer 130a may be stacked on the first pixel layer 120a, and the third pixel layer 140a may be stacked on the second pixel layer 120a.

As illustrated in FIG. 3, the first pixel layer 120a may be attached to the one surface S of the IC device 110. In this case, the first pixel layer 120a may be formed to cover all the pixel areas A in the one surface S of the IC device 110. In this case, the first pixel layer 120a may be attached to the one surface S of the IC device 110 through the first adhesion layer 121.

For example, if the first pixel layer 120a has been formed to emit a red light, the first pixel layer 120a may be attached to the one surface S of the IC device 110 according to an etching scheme or epitaxial lift off (ELO) scheme. According to the etching scheme, the first pixel layer 120a may be directly grown on the first substrate and attached to the one surface S of the IC device 110. Thereafter, the first substrate may be removed by an etching application. According to the ELO scheme, the first pixel layer 120a may be grown on the first substrate with a sacrificial layer interposed therebetween, and may be attached to the one surface S of the IC device 110. Thereafter, the first substrate may be removed by desorption, and the sacrificial layer may be removed by an etching application.

As illustrated in FIG. 4, the second pixel layer 130a may be stacked on the first pixel layer 120a in a direction parallel to the one axis X. In this case, the second pixel layer 130a may be formed to cover at least some of the first pixel layer 120a while covering all the pixel areas A in the one surface S of the IC device 110. In this case, the second pixel layer 130a may be attached to the first pixel layer 120a through the second adhesion layer 131.

For example, if the second pixel layer 130a has been formed to emit a green light or a blue light, the second pixel layer 130a may be attached to the first pixel array 120a according to any one of a laser lift off (LLO) scheme, the ELO scheme or the etching scheme. According to the LLO scheme, the second pixel array 130a may be directly grown on the second substrate and attached to the first pixel array 120a. Thereafter, the second substrate may be removed by laser radiation. According to the ELO scheme, the second pixel layer 130a may be grown on the second substrate with a sacrificial layer interposed therebetween and attached to the first pixel array 120a. Thereafter, the second substrate may be removed by desorption, and the sacrificial layer may be removed by an etching application. According to the etching scheme, the second pixel layer 130a may be directly grown on the second substrate and attached to the first pixel layer 120a. Thereafter, the second substrate may be removed by an etching application.

As illustrated in FIG. 5, the third pixel layer 140a may be stacked on the second pixel layer 130a in a direction parallel to the one axis X. In this case, the third pixel layer 140a may be formed to cover at least some of the second pixel layer 130a while covering all the pixel areas A in the one surface S of the IC device 110. In this case, the third pixel layer 140a may be attached to the second pixel layer 130a through the third adhesion layer 141.

For example, if the third pixel layer 140a has been formed to emit a green light or a blue light, the third pixel layer 140a may be attached to the second pixel array 130a according to any one of the LLO scheme, the ELO scheme or the etching scheme. According to the LLO scheme, the second pixel array 140a may be directly grown on the third substrate and attached to the second pixel array 130a. Thereafter, the third substrate may be removed by laser radiation. According to the ELO scheme, the third pixel layer 140a may be grown on the third substrate with a sacrificial layer interposed therebetween and may be attached to the second pixel array 130a. Thereafter, the third substrate may be removed by desorption, and the sacrificial layer may be removed by an etching application. According to the etching scheme, the third pixel layer 140a may be directly grown on the third substrate and attached to the second pixel layer 130a. Thereafter, the third substrate may be removed by an etching application.

According to another embodiment, although not illustrated, the pixel layers 120a, 130a, and 140a may be stacked in a direction parallel to the one axis X to form the assemblies 120a, 130a, and 140a. Thereafter, the assemblies 120a, 130a, and 140a may be attached to the one surface S of the IC device 110. For example, the first pixel layer 120a may be prepared. In this case, if an area is defined in a direction vertical to the one axis X, the area of the first pixel layer 120a may be equal to or greater than the area of the pixel areas A in the one surface S of the IC device 110. The second pixel layer 130a may be stacked on the first pixel layer 120a. In this case, the second pixel layer 130a may be formed to cover at least some of the first pixel layer 120a. In this case, the second pixel layer 130a may be stacked on the first pixel layer 120a through the second adhesion layer 131. The third pixel layer 140a may be stacked on the second pixel layer 130a. In this case, the third pixel layer 140a may be formed to cover at least some of the second pixel layer 130a. In this case, the third pixel layer 140a may be stacked on the second pixel layer 130a through the third adhesion layer 141. Accordingly, the assemblies 120a, 130a, and 140a may be formed. Thereafter, the assemblies 120a, 130a, and 140a may be attached to the one surface S of the IC device 110 through the first adhesion layer 121 of the first pixel layer 120a.

Figure 6A:
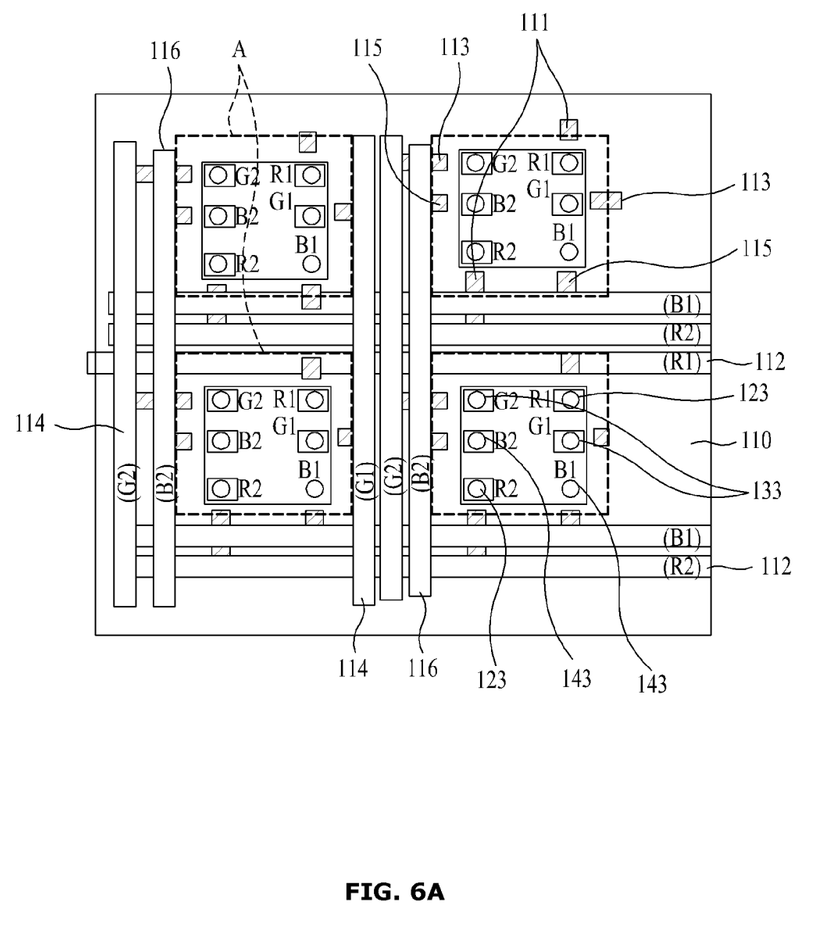
Figure 6B:
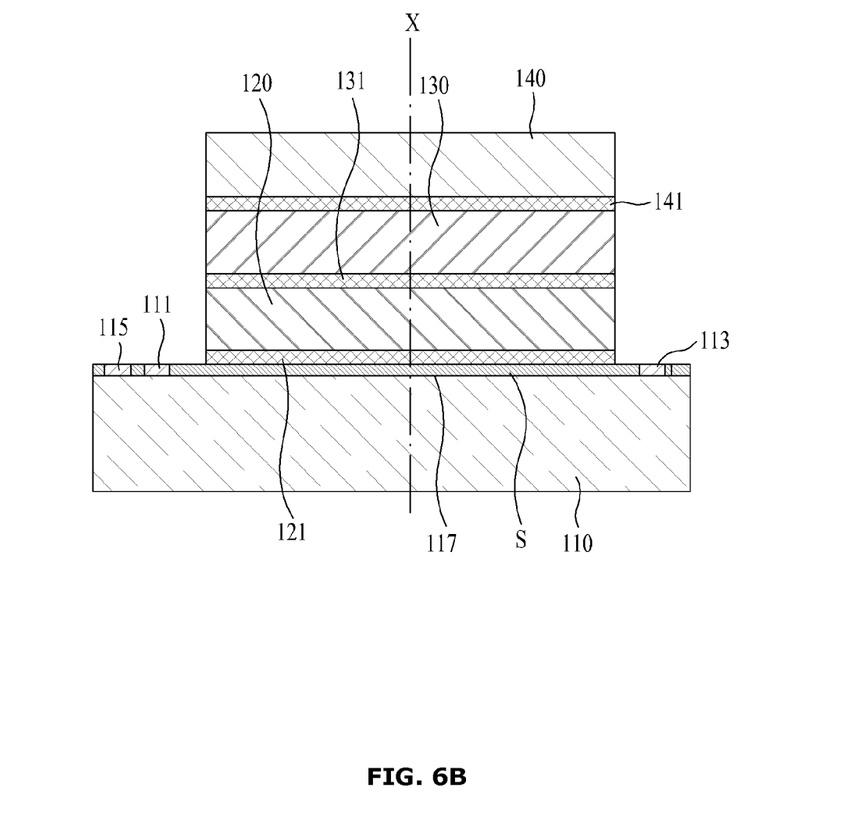

Next, as illustrated in FIGS. 6A and 6B, the assemblies 120a, 130a, and 140a may be cut in the one surface S of the IC device 110, so the assemblies 120a, 130a, and 140a may be divided into the pixels 120, 130, and 140. In this case, the assemblies 120a, 130a, and 140a may be cut along the boundary between the pixel areas A, between the pixel areas A. Accordingly, the pixels 120, 130, and 140 may be divided so that the pixels 120, 130, and 140 are disposed in the pixel areas A. In this case, the first pixel layer 120a may be divided into the first partial pixels 120, the second pixel layer 130a may be divided into the second partial pixels 130, and the third pixel layer 140a may be divided into the third partial pixels 140. Accordingly, the pixels 120, 130, and 140 may be arrayed according to the pixel structure in the one surface S of the IC device 110.

According to one embodiment, the pads 111, 113, and 115 of the IC device 110 and the electrodes 123, 133, and 143 of the pixels 120, 130, and 140 may be exposed in each of pixel areas A. The electrodes 123, 133, and 143 may include first electrodes 123, second electrodes 133 and third electrodes 143. Each of the first electrodes 123 may be positioned in the first partial pixel 120 and electrically connected to the first partial pixel 120. Each of the second electrodes 133 may be positioned in the second partial pixel 130 and electrically connected to the second partial pixel 130. Each of the third electrodes 143 may be positioned in the third partial pixel 140 and electrically connected to the third partial pixel 140.

Figure 7A:
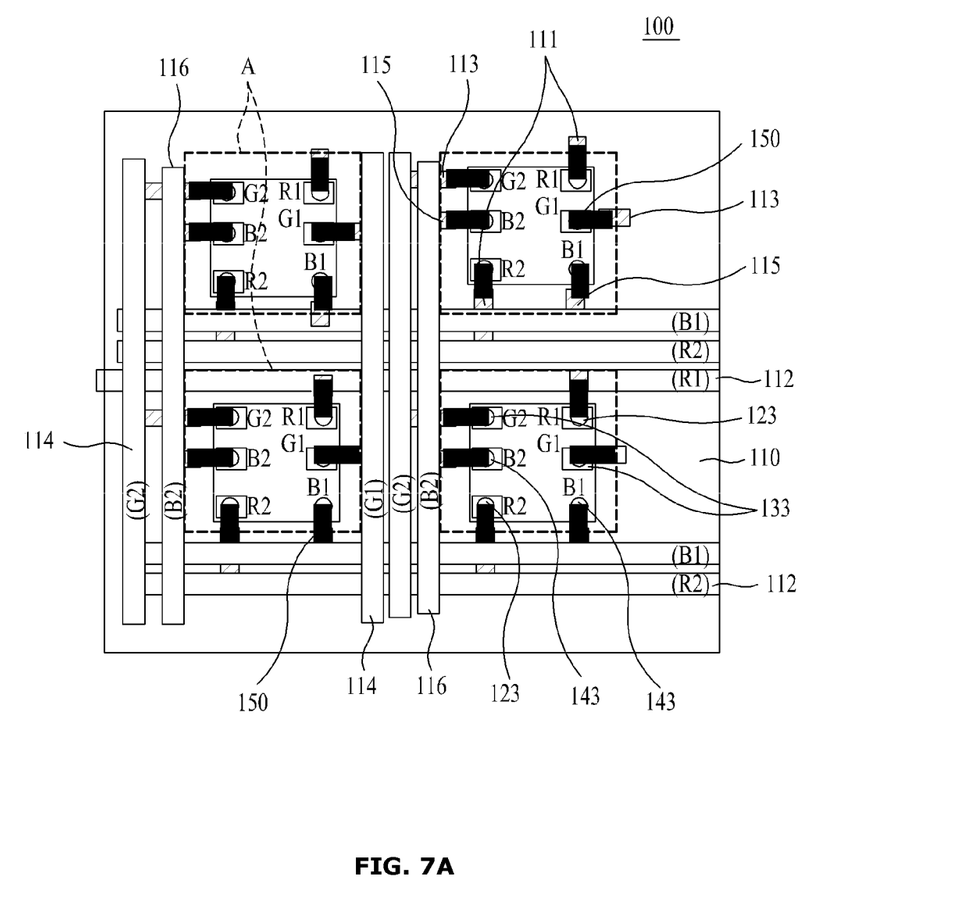
Figure 7B:
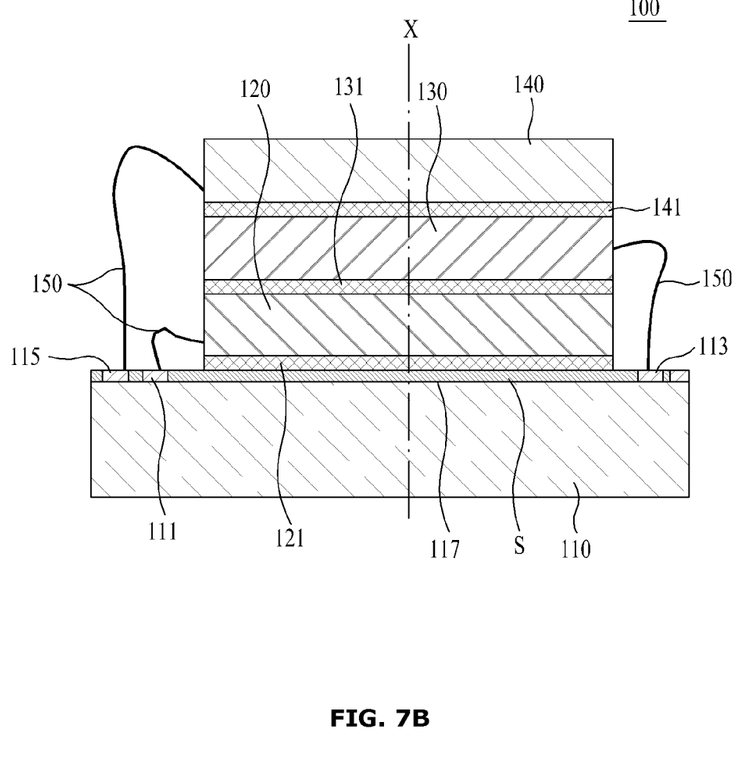

Next, as illustrated in FIGS. 7A and 7B, the connection members 150 may electrically connect the pixels 120, 130, and 140 to the IC device 110. For example, the connection members 150 may include wires made of metal. The connection members 150 may individually connect the partial pixels 120, 130, and 140 to the pads 111, 113, and 115 of the IC device 110. In this case, the connection members 150 may connect the respective first partial pixels 120 and the respective first pads 111, may connect the respective second partial pixels 130 and the respective second pads 113, and may connect the respective third partial pixels 140 and the respective third pads 115.

According to one embodiment, the connection members 150 may connect the respective first electrodes 123 to the respective first pads 111, may connect the respective second electrodes 133 to the respective second pads 113, and may connect the respective third electrodes 143 to the respective third pads 115.

Accordingly, the display 100 according to various embodiments may be fabricated. When the display 100 operates, the IC device 110 provides a driving signal to the pixels 120, 130, and 140. The pixels 120, 130, and 140 may output image light based on the driving signal. In this case, in the pixels 120, 130, and 130, the first partial pixel 120 may emit a first color light, the second partial pixel 130 may emit a second color light, and the third partial pixel 140 may emit a third color light. Accordingly, the pixels 120, 130, and 130 may implement an image.

The display 100 according to various embodiments may include the IC device 110 in which the driving circuit has been wired, the plurality of pixels 120, 130, and 140 arrayed on the one surface S of the IC device 110, wherein the plurality of partial pixels 120, 130, and 140 for emitting different color lights has been stacked on the plurality of pixels 120, 130, and 140, and the connection members 150 electrically connecting the partial pixels 120, 130, and 140 to the driving circuit.

According to various embodiments, the pixels 120, 130, and 140 may be divided from the assemblies 120a, 130a, and 140a formed in the one surface S by cutting the assemblies 120a, 130a, and 140a on which the plurality of pixel layers 120a, 130a, and 140a for emitting different color lights has been stacked.

According to various embodiments, the partial pixels 120, 130, and 140 may be individually divided from the pixel layers 120a, 130a, and 140a.

According to various embodiments, the partial pixels 120, 130, and 140 may include the first partial pixel 120 mounted on the one surface S and for emitting a first color light, the second partial pixel 130 stacked on the first partial pixel 120 and for emitting a second color light, and the third partial pixel 140 stacked on the second partial pixel 130 and for emitting a third color light.

According to various embodiments, the connection members 150 may include wires made of metal.

According to various embodiments, the IC device 110 may include the plurality of pads 111, 113, and 115 connected to the driving circuit, disposed in the one surface S, and connected to the partial pixels 120, 130, and 140, respectively, through the connection members 150.

According to various embodiments, the color light may include at least one of a red light, a green light or a blue light.

A method of fabricating the display 100 according to various embodiments may include providing the IC device 110 in which the driving circuit has been wired, forming, in the one surface S of the IC device 110, the plurality of pixels 120, 130, and 140 in which the plurality of partial pixels 120, 130, and 140 for emitting different color lights has been stacked, and electrically connecting the partial pixels 120, 130, and 140 to the driving circuit using the connection members 150.

According to various embodiments, the forming of the pixels 120, 130, and 140 may include forming, in the one surface S, the assemblies 120a, 130a, and 140a on which the plurality of pixel layers 120a, 130a, and 140a for emitting different color lights has been stacked, and dividing the assemblies 120a, 130a, and 140a into the pixels 120, 130, and 140 by cutting the assemblies.

According to various embodiments, the partial pixels 120, 130, and 140 may be individually divided from the pixel layers 120a, 130a, and 140a.

According to various embodiments, the partial pixels 120, 130, and 140 may include the first partial pixel 120 mounted on the one surface S and for emitting a first color light, the second partial pixel 130 stacked on the first partial pixel 120 and for emitting a second color light, and the third partial pixel 140 stacked on the second partial pixel 130 and for emitting a third color light.

According to various embodiments, the forming of the assemblies 120a, 130a, and 140a may include growing the first pixel layer 120a to be divided as the first partial pixel 120, the second pixel layer 130a to be divided as the second partial pixel 130, and the third pixel layer 140a to be divided as the third partial pixel 140 on a first substrate, a second substrate, and a third substrate, respectively, attaching the first pixel layer 120a to the one surface S, removing the first substrate from the first pixel layer 120a, stacking the second pixel layer 130a on the first pixel layer 120a, removing the second substrate from the second pixel layer 130a, stacking the third pixel layer 140a on the second pixel layer 130a, and removing the third substrate from the third pixel layer 140a.

According to one embodiment, at least one of the first substrate, the second substrate or the third substrate may be removed by at least one of laser radiation or an etching application.

According to another embodiment, the growing of the first pixel layer 120a, the second pixel layer 130a and the third pixel layer 140a may include placing a sacrificial layer on at least one of the first substrate, the second substrate or the third substrate and growing the first pixel layer 120a, the second pixel layer 130a and the third pixel layer 140a.

According to another embodiment, at least one of the first substrate, the second substrate or the third substrate may be removed by desorption.

According to another embodiment, the sacrificial layer may be removed by an etching application after at least one of the first substrate, the second substrate or the third substrate is removed.

According to various embodiments, the connection members 150 may include wires made of metal.

According to various embodiments, the IC device 110 may include the plurality of pads 111, 113, and 115 connected to the driving circuit, disposed in the one surface S, and connected to the partial pixels 120, 130, and 140, respectively, through the connection members 150.

According to various embodiments, the color light may include at least one of a red light, a green light or a blue light.

According to various embodiments, the pixels 120, 130, and 140 may be implemented in a form in which the plurality of partial pixels 120, 130, and 140 has been stacked on the IC device 110. Accordingly, the structure of the pixels 120, 130, and 140 can be simplified. Accordingly, a reduction in the size of the pixels 120, 130, and 140 and lower power for the pixels can be realized at the same time. In this case, the pixels 120, 130, and 140 may be formed on the IC device 110 using a semiconductor fabrication scheme. Accordingly, a method of fabricating the display 100 can be simplified. Accordingly, the display 100 can be easily fabricated. Furthermore, the pixels 120, 130, and 140 can be accurately arrayed on the IC device 100 according to a pixel structure because the pixel arrays 120a, 130a, and 140a stacked on the IC device 110 are cut at a time and the pixels 120, 130, and 140 are divided.

The embodiments of this document and the terms used in the embodiments are not intended to limit the technology described in this document to a specific embodiment, but should be construed as including various changes, equivalents and/or alternatives of a corresponding embodiment. Regarding the description of the drawings, similar reference numerals may be used in similar elements. An expression of the singular number may include an expression of the plural number unless clearly defined otherwise in the context. In this document, an expression, such as "A or B", "at least one of A or/and B", "A, B or C" or "at least one of A, B and/or C", may include all of possible combinations of listed items together. Expressions, such as "a first," "a second," "the first" and "the second", may modify corresponding elements regardless of the sequence and/or importance, and are used to only distinguish one element from the other element and do not limit corresponding elements. When it is described that one (e.g., first) element is "(operatively or communicatively) connected to" or "coupled with" the other (e.g., second) element, one element may be directly connected to the other element or may be connected to the other element through another element (e.g., third element).

The "module" used in this document includes a unit configured with hardware, software or firmware, and may be interchangeably used with a term, such as logic, a logical block, a part or a circuit. The module may be an integrated part, a minimum unit to perform one or more functions, or a part thereof. For example, the module may be configured with an application-specific integrated circuit (ASIC).

According to various embodiments, each (e.g., module or program) of the described elements may include a single entity or a plurality of entities. According to various embodiments, one or more of the aforementioned elements or operations may be omitted or one or more other elements or operations may be added. Alternatively or additionally, a plurality of elements (e.g., modules or programs) may be integrated into one element. In such a case, the integrated elements may perform one or more functions of each of a plurality of elements identically with or similar to that performed by a corresponding one of the plurality of elements before the elements are integrated. According to various embodiments, module, operations performed by a program or other elements may be executed sequentially, in parallel, repeatedly, or heuristically, or one or more of the operations may be executed in different order or may be omitted, or one or more other operations may be added.

According to various embodiments, the pixels can be implemented in a form in which a plurality of partial pixels has been stacked on the IC device. Accordingly, the structure of the pixels can be simplified. Accordingly, a reduction in the size of the pixels and lower power for the pixels can be realized at the same time. In this case, the pixels may be formed on the IC device using a semiconductor fabrication scheme. Accordingly, a method of fabricating a display can be simplified. Accordingly, the display can be easily fabricated. Furthermore, the pixels can be accurately arrayed on the IC device based on a pixel structure because pixel arrays stacked on the IC device are cut at a time and the pixels are divided.

What is claimed is:

1. A method of fabricating a display, comprising:
   providing an integrated circuit (IC) device in which a driving circuit has been wired;
   attaching an insulating layer to the IC device, wherein the insulating layer is co-planar with the driving circuit;
   forming, in one surface of the IC device, a plurality of pixels areas;
   stacking a plurality of pixel layers to form assemblies;
   cutting the assemblies, dividing the pixels from assemblies formed on the insulating layer, wherein the pixels comprise:
   a first partial pixel mounted on the insulating layer and for emitting a first color light;
   a second partial pixel stacked on the first partial pixel and for emitting a second color light; and
   a third partial pixel stacked on the second partial pixel and for emitting a third color light;
   connecting a plurality of conductive pads to the driving circuit, positioned in the insulating layer thereby forming a conductive path through the insulating layer; and
   electrically connecting the partial pixels individually to the driving circuit through the plurality of pads using connection members, the connection members comprising two metal wires for each of the three partial pixels.

2. The method of claim 1, wherein the step of stacking the plurality of pixel layers further comprises:
   growing a first pixel layer to be divided as the first partial pixel, a second pixel layer to be divided as the second partial pixel, and a third pixel layer to be divided as the third partial pixel on a first substrate, a second substrate, and a third substrate, respectively;
   attaching the first pixel layer to the one surface;
   removing the first substrate from the first pixel layer;
   stacking the second pixel layer on the first pixel layer;
   removing the second substrate from the second pixel layer;
   stacking the third pixel layer on the second pixel layer; and
   removing the third substrate from the third pixel layer, wherein the first pixel layer, the second pixel layer, and the third pixel layer have equivalent dimensions.

3. The method of claim 2, wherein at least one of the first substrate, the second substrate or the third substrate is removed by at least one of laser radiation or an etching application.

4. The method of claim 2, wherein the growing of the first pixel layer, the second pixel layer and the third pixel layer comprises:
   placing a sacrificial layer on at least one of the first substrate, the second substrate or the third substrate and growing the first pixel layer, the second pixel layer and the third pixel layer,
   wherein at least one of the first substrate, the second substrate or the third substrate is removed by desorption, and
   wherein the sacrificial layer is removed by an etching application after at least one of the first substrate, the second substrate or the third substrate is removed.

5. The method of claim 1, wherein the first color light comprises at least one of a red light, a green light or a blue light.

6. The method of claim 1, further comprising adhesively joining the first partial pixel to the second partial pixel without an intervening layer.

7. The method of claim 1, further comprising a plurality of buses, including a first bus and a second bus, wherein each of the buses is connected to the driving circuit and each of the buses is connected to at least one conductive pad from the plurality of conductive pads, wherein the plurality of conductive pads are connected to the driving circuit by the plurality of buses, and wherein the first bus is perpendicular to the second bus.

8. A display comprising:
an integrated circuit (IC) device in which a driving circuit has been wired;
an insulating layer on the IC device, wherein the insulating layer is co-planar with the driving circuit
a plurality of pixel areas arrayed in one surface of the IC device, wherein an assembly formed with a plurality of pixel layers for emitting different color lights has been stacked on the plurality of pixel areas to form a plurality of pixels comprising partial pixels, and wherein the pixels are divided from the assembly formed in the insulating layer by cutting the assembly, wherein the partial pixels comprise:
a first partial pixel mounted on the insulating layer and for emitting a first color light;
a second partial pixel stacked on the first partial pixel and for emitting a second color light; and
a third partial pixel stacked on the second partial pixel and for emitting a third color light;
a plurality of conductive pads connected to the driving circuit, positioned in the insulating layer thereby forming a conductive path through the insulating layer; and
connection members electrically connecting the partial pixels individually to the driving circuit through the plurality of pads, the connection members comprising two metal wires for each of the three partial pixels.

9. The display of claim 8, wherein the first color light comprises at least one of a red light, a green light or a blue light.

10. The display of claim 8, wherein the first partial pixel is adhesively joined to the second partial pixel without an intervening layer.

11. The display of claim 8, further comprising a plurality of buses, including a first bus and a second bus, wherein each of the buses is connected to the driving circuit and each of the buses is connected to at least one conductive pad from the plurality of conductive pads, wherein the plurality of conductive pads are connected to the driving circuit by the plurality of buses, and wherein the first bus is perpendicular to the second bus.

* * * * *